United States Patent [19]

Kakumu

[11] Patent Number: 4,812,889
[45] Date of Patent: Mar. 14, 1989

[54] SEMICONDUCTOR DEVICE FET WITH REDUCED ENERGY LEVEL DEGENERATION

[75] Inventor: Masakazu Kakumu, Yokohama, Japan

[73] Assignee: Kabushiki Kaisha Toshiba, Kawasaki, Japan

[21] Appl. No.: 908,028

[22] Filed: Sep. 16, 1986

[30] Foreign Application Priority Data

Sep. 24, 1985 [JP] Japan ................ 60-210423

[51] Int. Cl.⁴ .................................... H01L 27/02
[52] U.S. Cl. ................... 357/42; 357/23.12; 357/59; 357/67
[58] Field of Search ........... 357/42, 23.12, 59 G, 357/59 I, 67 S

[56] References Cited

U.S. PATENT DOCUMENTS

| | | | |
|---|---|---|---|
| 3,738,880 | 6/1973 | Laker | 357/59 G X |
| 3,793,090 | 2/1974 | Barile et al. | 357/59 G X |
| 4,258,465 | 3/1981 | Yasui et al. | 357/596 X |
| 4,329,706 | 5/1982 | Crowder et al. | 357/59 I X |
| 4,590,509 | 5/1986 | Esser et al. | 357/596 X |
| 4,612,565 | 9/1986 | Shimizu et al. | 357/59 I X |

FOREIGN PATENT DOCUMENTS

| | | | |
|---|---|---|---|
| 0514627 | 2/1976 | Japan | 357/23 D |
| 54-28071 | 9/1979 | Japan | 357/23.12 |
| 54-28072 | 9/1979 | Japan | 357/23 D |
| 59-114859 | 7/1984 | Japan | . |

OTHER PUBLICATIONS

Murarka, "Refractory Silicides for Integrated Circuits," *J. Vac. Sci. Technol.*, 17(4), Jul./Aug. 1980, pp. 775–792.

*Primary Examiner*—Andrew J. James
*Assistant Examiner*—William A. Mintel
*Attorney, Agent, or Firm*—Oblon, Fisher, Spivak, McClelland & Maier

[57] ABSTRACT

A semiconductor device comprises a semiconductor substrate of a first conductivity type, a first impurity region of second conductivity which is formed in the substrate, a second impurity region of the second conductivity type which is formed in the substrate and spaced apart from the first semiconductor region, a channel region located between the first and second impurity regions, an insulation layer on the channel region, and a gate electrode on the insulation layer including conductive layer means for decreasing the temperature dependence of the semiconductor device, the layer means including a conductive layer and a semiconductive layer for reducing energy level degeneration.

7 Claims, 5 Drawing Sheets

SEMICONDUCTOR DEVICE FET WITH REDUCED ENERGY LEVEL DEGENERATION

BACKGROUND OF THE INVENTION

1. Field of the Invention

This invention relates to a semiconductor device and method of fabricating the same and more particularly, to a semiconductor device having an improved gate electrode or interconnection layer and a method of fabricating the same.

2. Description of the Prior Art

Complementary MOS type semiconductor devices, in particular, CMOS inverters, are conventionally fabricated by means of the following process.

Firstly, as shown in FIG. 1(a), a p-type well region 51 of approximately 5 micro-meter depth is formed in an n-type silicon (Si) substrate 50 having a crystal plane of (100). Impurity layers 52 and a oxidation layer 53 are formed for device isolation. Thus isolation regions 64 are formed. A gate dioxide layer 55 having a thickness between 10 nano-meter and 50 nano-meter, shown in FIG. 1(b), is fabricated in the device formation region by thermal oxidation. An n-type polycrystalline silicon layer is formed thereover and patterned by a photo-etching process to form gate electrode 56.

Next, n-channel MOS transistor source and drain regions 57 and potential extraction region 58 of substrate 50 are respectively formed by selective ion implantation of n-type impurities such as arsenic (As) ions. Then, p-type impurity ions, such as boron (B), are selectively implanted to form the source and drain regions of the p-channel MOS transistor and potential extraction region 60 of p-type well region 51. Subsequently, as shown in FIG. 1(c), a protective oxidation layer 61 is deposited by CVD (Chemical Vapour Deposition) method or the like. Contact holes are formed and an aluminum firing pattern 62 is formed.

The manufacturing processes used in the fabrication of the type of CMOS inverter described are the techniques widely used in the fabrication of conventional complementary metal oxide semiconductor devices.

Here, polycrystalline silicon is used as the firing material of gate electrode 56. Gate electrode 56 is used as a mask for forming the drain and source. The polysilicon is furthermore capable of withstanding subsequent heat treatment processing at extremely high temperatures.

The specific resistivity of the polycrystalline silicon has only decreased by $10^{-3}$ ohms cm, despite the introduction of high impurity concentrations. This has prevented high speed operation of a micropatterned element.

In view of this, in place of polycrystalline silicon, a two layer electrode structure formed of metal polycide comprised of polycrystalline silicon and metal silicide or molybdenum silicide which has a resistivity about 1/10 that of polysilicon has been used.

However, since the work function of these electrodes is constant regardless of ambient temperature and the work function of the channel region of the MOS transistor changes with changes in the ambient temperature, the difference of the mutual work function thereof increases in accordance with the changing ambient temperature. As a result, the threshold voltage temperature dependency of MOS transistors using these electrodes is greatly increased. This means that the fluctuation of threshold voltage for a given temperature variation is extremely increased. Thus, this greatly affects the stability of the MOS transistor's operating speed.

SUMMARY OF THE INVENTION

It is, therefore, an object of the present invention to provide a semiconductor device and a method of fabricating the same in which the threshold voltage temperature dependency can be reduced by reducing the energy level degeneration of the electrode or interconnection layer which is comprised of either metal silicide or metal polycide of low resistivity.

A semiconductor device comprises a semiconductor substrate of a first conductivity type, a first impurity region of second conductivity which is formed in the substrate, a second impurity region of the second conductivity type which is formed in the substrate and spaced apart from the first semiconductor region, a channel region located between the first and second impurity regions, an insulation layer on the channel region, and a gate electrode on the insulation layer including conductive layer means for decreasing the temperature dependence of the semiconductor device, the layer means including a conductive layer and a semiconductive layer for reducing energy level degeneration.

A method of fabricating a semiconductor device, comprising the steps of, selectively doping an impurity of a second conductivity type in a semiconductor substrate of a first conductivity type to form first and second impurity regions which are spaced apart so as to define a channel region therebetween, forming a gate insulation film on the substrate, forming a metal silicide layer containing a stoichiometrically excessive amount of silicon and impurity ion levels insufficient to cause an energy level degeneration on a portion of the gate insulation film which corresponds to the channel region, thereby providing a gate electrode, and annealing the metal silicide at a temperature not lower than the phase transformation temperature thereof for segregating a stoichiometrically excessive amount of silicon from the metal silicide at the interface between the metal silicide and the gate insulation film for reducing energy level degeneration thereof.

DETAILED DESCRIPTION OF THE PREFERRED EMBODIMENTS

The preferred embodiment of the present invention will now be described with reference to the corresponding views.

FIGS. 2a to 2g show sectional views of the fabrication process for CMOS inverter in which the gate electrode is fabricated of molybdenum silicide.

Figure 1A:
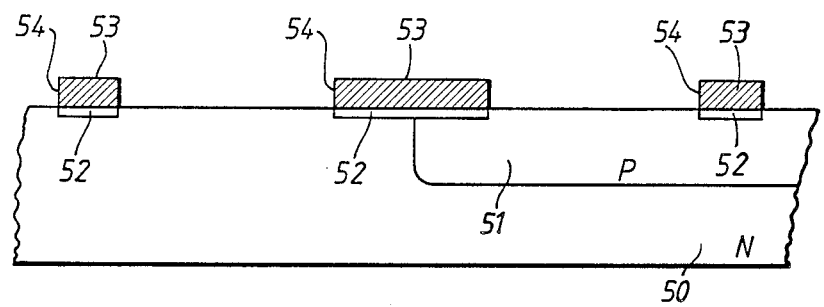
FIGS. 1a to 1c are sectional views showing the fabrication process of a conventional device.
Figure 1B:
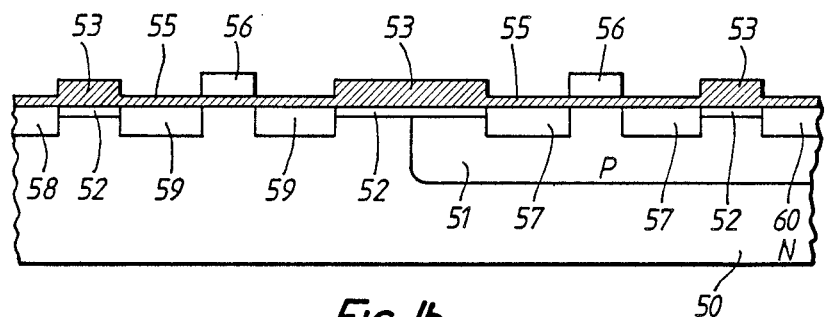
Figure 1C:
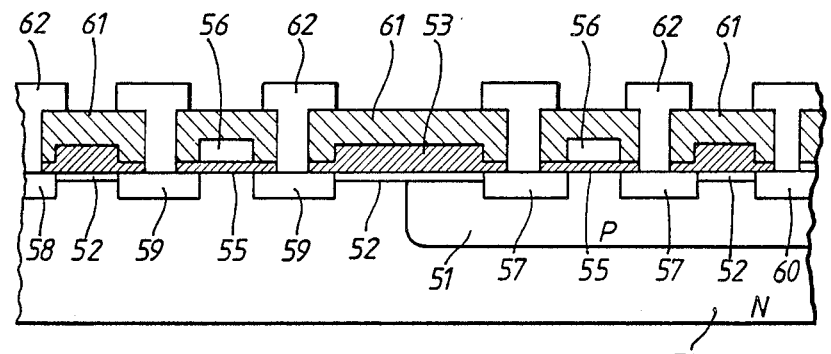
Figure 2A:
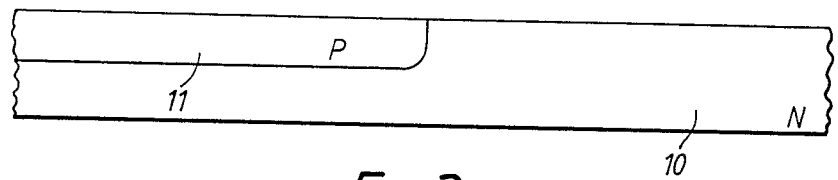
FIGS. 2a to 2g are sectional views showing the fabrication process of one embodiment of the semiconductor device related to this invention.
Figure 2B:
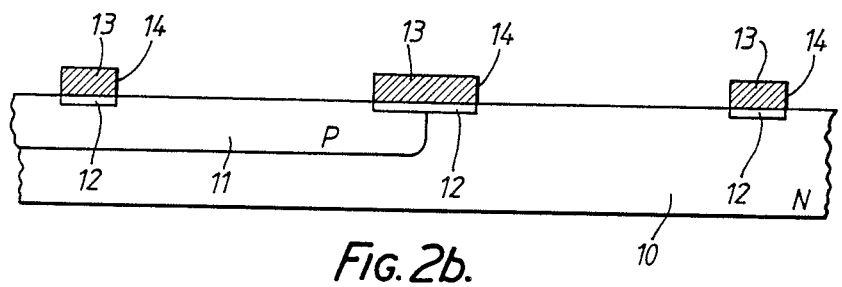
Figure 2C:
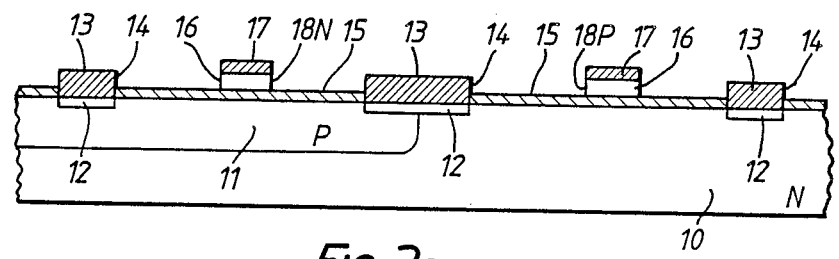

Firstly, as shown in FIG. 2(a), a p-type well region 11 of 3 micro-meter to 5 micro-meter depth, is formed on an n-type silicon substrate 10 with a crystal plane (100) and a resistivity of approximately 10 ohms cm. In the subsequent process, as shown in FIG. 2(b), device isolation impurity region 12 is diffused in substrate 10 of the device isolation region, with the fabrication of device isolation oxidation layer 13, to form isolation region 14.

Next, as shown in FIG. 2 (c), after a gate electrode oxidation layer 15 of 10 nano-meter to 50 nano-meter thickness is formed on the device formation region, a molybdenum-silicide (Mox Siy) layer 16 of 300 nano-meter to 600 nano-meter thickness is deposited. And the gate electrode regions corresponding to n and p-channel MOS transistors are implanted with arsenic ion concentrations of $1 \times 10^{13}$ cm$^{-2}$ at acceleration voltages of 40 KeV and with boron ion concentrations of $1 \times 10^{13}$ cm$^{-2}$ at acceleration voltages of 40 KeV, respectively.

A silicon oxidation layer 17 is deposited over the entire surface by the CVD method. Gate electrodes 18N and 18P of the n-channel and p-channel MOS transistors are formed by patterning the aforementioned molybdenum-silicide layer 16 and silicon oxidation layer 17 using a photoetching process. The molybdenum silicide layer 16 used here is such that the Mox-Siy formation ratio is Y/K>2.

Figure 2D:
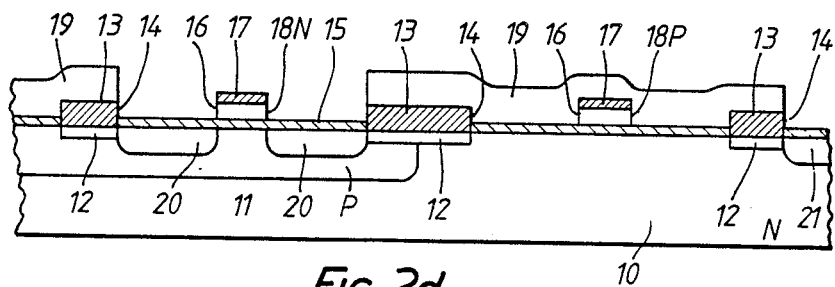
Figure 2E:
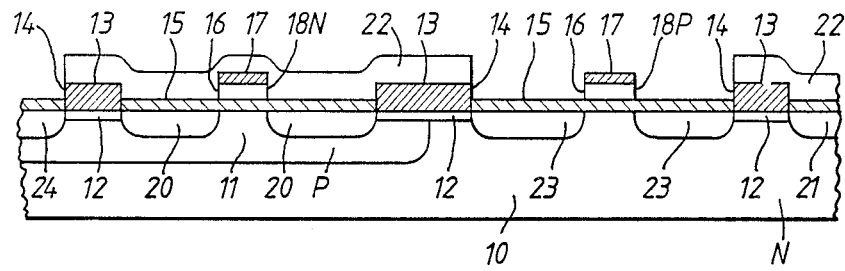

Next, resist 19 is formed on the entire surface. As shown in FIG. 2(d), resist 19 is selectively removed to expose the n-channel source and drain regions, gate electrode 18N and substrate potential extraction region. Then, the n-channel MOS transistor source and drain regions 20 and substrate potential extraction region 21 are respectively formed by ion implantating arsenic ions into the p-type well region 11 and substrate 10 under acceleration voltage conditions of 40 KeV and dose quantities of $3 \times 10^{15}$ cm$^{-2}$ using resist 19 as the mask. Following this, resist 19 used in the ion implantation process, is removed from the entire surface. A new resist 22 is placed over the entire surface. Then, as shown in FIG. 2(e), resist 22 is selectively removed to expose the p-channel MOS device source and drain regions, gate electrode 18P and p-type well region potential extraction region 24. At this point, p-channel MOS transistor source and drain regions 23 and p-type well region potential extraction region 24 are respectively formed by ion implantation of boron ions into the substrate and p-type well region 11 under acceleration voltage conditions of 40 KeV and dose quantities of $3 \times 10^{15}$ cm$^{-2}$ using resist 22 as the mask.

Figure 2F:
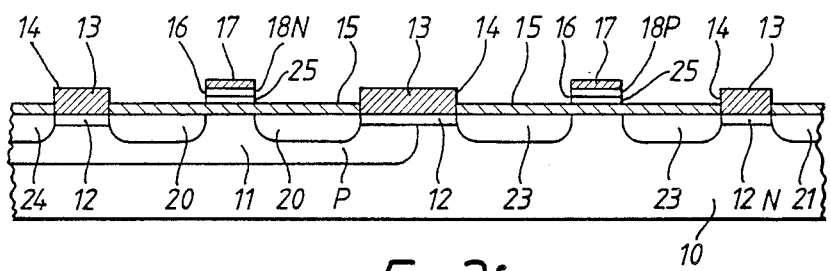

Resist 22 is again removed from the entire surface and heat treatment is performed at temperatures in the region of 480° C. to 1000° C. The temperature of the thermal process is higher than that of the refractory metal silicide phase transformation temperature. Then, as shown in FIG. 2(f), the excessive silicon within molybdenum silicide gate electrodes 18N and 18P is segregated into the boundary surface between the molybdenum-silicide layer 16 and gate oxidation layer 15 to form silicon diffusion layer 2. This silicon diffusion layer 25 is composed of polycrystalline silicon. Since arsenic ions are implanted into molybdenum-silicide layer 16 of gate electrode 18N of the n-channel MOS transistor and boron ions are implanted into molybdenum-silicide layer 16 of gate electrode 18P of the p-channel MOS transistor, n-type polycrystalline silicon is formed on the surface of gate oxidation layer 15 of the n-channel device and p-type polycrystalline silicon is formed on the gate oxidation surface of the p-channel device.

Figure 2G:
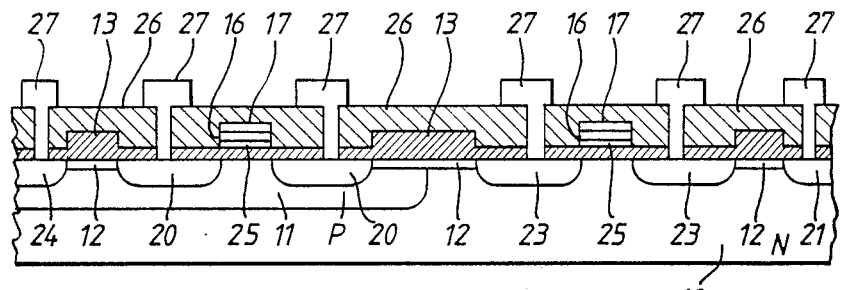

As shown in FIG. 2(g) a protective oxidation layer 26 is deposited over the entire substrate surface using the conventional CVD process. Contact holes for the electrode extraction region are opened on the protective oxidation layer 26. An aluminium metallization layer is deposited and patterned to form firing pattern 27.

Thus, the threshold voltages of the n-channel with a substrate 10 of impurity concentration of $5 \times 10^{15}$ cm$^{-3}$ and p-channel MOS transistors of p-type well region 11 of impurity concentration of $2 \times 10^{16}$ cm$^{-3}$, are approximately +0.8 V and −0.8 V, respectively.

Also, the impurity concentration of silicon diffusion layer 25 is $1 \times 10^{17}$ cm$^{-3}$. The energy level of silicon diffusion layer 25 does not cause any degeneration and the threshold voltage of the device changes corresponding to the temperature. Consequently, compared with the fabrication of n-type polycrystalline silicon gate electrodes of the conventional device, fluctuations in the threshold voltage of n-channel and p-channel MOS transistors ar controlled corresponding to temperature variations,.

The MOS transistor threshold voltage Vth is given by the following quotation:

$$Vth = \phi m + \phi f + A \times f(\phi f) + B \quad \quad 1$$

where, $\phi$ m is the Fermi level of the metal, $\phi$ f is the Fermi level difference from that of an intrinsic semiconductor, and A and B are constants.

In n-type polycrystalline silicon gate electrodes of conventional devices, the temperature dependency of the threshold voltage Vth is increased, because $\phi$ f is dependent on temperature but $\phi$ m is independent of temperature.

However, in the device of this invention, the temperature dependency of the threshold voltage Vth is decreased, because the gate electrode metal work function $\phi$ m changes with temperature so as to reduce the variation of $\phi$f.

Figure 3:
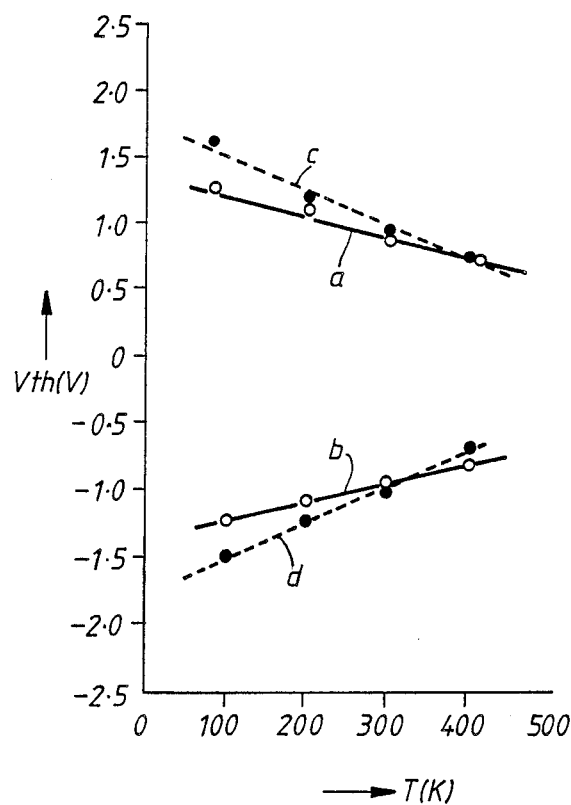
FIG. 3 shows a graph showing the relationship between the temperature and the threshold voltage of a semiconductor device of the present invention together with that of a conventional semiconductor device.

FIG. 3 is a characteristic graph showing the temperature dependency of the threshold voltage of the n-channel and p-channel MOS transistors for the device of this embodiment and for the conventional device. The horizontal axis represents Absolute Temperature T K), and the vertical axis represents Threshold Voltage Vth.

As can be seen from the threshold voltage temperature dependency characteristics of the n- and p-channel MOS transistors, in this embodiment, indicated by full lines "a" and "b", variations are less than for those of the threshold voltage temperature dependency characteristics of the n-channel and p-channel MOS transistors of the conventional device, shown by broken lines c and d, in the graph.

These measurements are performed for each transistor by a channel width W of 5 micro-meter, channel length L of 20 micro-meter, and a drain voltage of 0.1 V. Since the threshold voltage fluctuations for the device in this embodiment are reduced for temperature, the drain current at low temperatures can be increased. Since this drain current can be increased, device operation speeds at low temperatures can be improved to exceed those of the conventional device.

Figure 4:
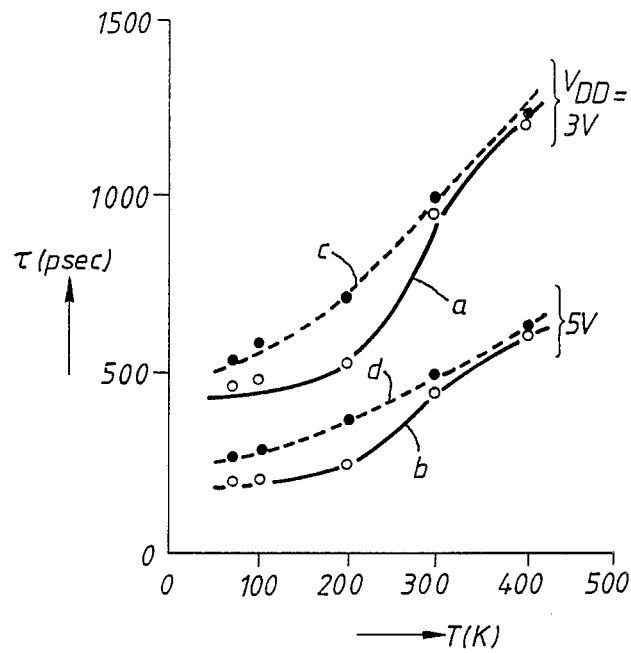
FIG. 4 shows a graph showing the relationship between the temperature and the delay time of a semiconductor device of the present invention together with that of a conventional semiconductor device.

FIG. 4 is a characteristic graph showing the temperature dependency of the delay time indicating the operating speed of the MOS transistors for the device in this embodiment and the conventional device. The horizontal axis represents Absolute Temperature T (K) and the vertical axis represents Delay Time (psec). It can be seen from the figure that the temperature dependency characteristics of the delay time of the MOS transistors in this embodiment, shown by full lines "a" and "b", with Vdd power supply voltages of 3 V and 5 V, can be improved, especially in the low temperature region, compared to the temperature dependency characteristics of the delay time of the MOS transistors of the conventional device shown by broken lines "c" and "d", in the graph.

When the Vdd power supply voltage is reduced, particularly in transistors with sub-micron order geometries, the high speed characteristics become more effective because the threshold voltage temperature dependency is further increased.

Also, as the fine line device geometry is further refined, the threshold voltage margin of the circuit generally becomes narrower. However, for the device in this embodiment, the threshold voltage stability is improved.

Figure 5:
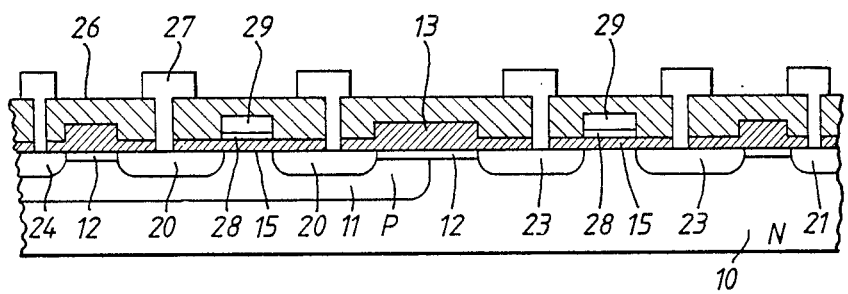
FIG. 5 is a sectional view showing the semiconductor device according to another embodiment of the present invention.

FIG. 5 is a sectional view showing the fabrication of a semiconductor device according to another embodiment of the present invention.

In the case of fabricating gate electrodes 18N and 18P of the n-channel and p-channel devices for this embodiment, polycrystalline silicon layer 28 is first deposited on gate oxidation layer 15. Molybdenum-silicide layer 29 is deposited on ate oxidation layer 15. Next, gate electrodes 18N and 18P are formed by patterning the deposition layer comprised of polycrystalline silicon layer 28 and molybdenum-silicide layer 29. Additionally, polycrystalline silicon layer 28 is doped with n-type and p-type impurity concentrations of $1 \times 10^{17}$ cm$^{-3}$.

With this type of fabrication, results similar to those exhibited for the devices in the first embodiment can be expected. In this case, the formation ratio of molybdenum-silicide layer 29 may be selected as required.

Furthermore, in the device of these embodiments, explanations are given for molybdenum silicide layer 16 or 29 with regard to the fabrication of gate electrodes 18N and 18P, but any of the silicides such as tungsten, titanium, tantalum, or platinum could be used. Any of the silicides having the high metallic melting point without melting during the high temperature heat treatment processing could be used. Also, in addition to ion implantation, an impurity doping method for high melting point metal silicides can be used, enabling the use of vapour phase and solid phase diffusion processes.

These embodiments of this invention are explained with regard to the construction of CMOS devices. It is possible, however, to fabricate the semiconductor device using only n-channel MOS transistors, making integrated circuits with highly refined geometries, with identical results, a real possibility. This invention could also be applied to wiring layer fabrication in the same way as it applied to the fabrication of gate electrodes.

In accordance with the invention described above, it is possible to present a semiconductor device which has a low threshold voltage temperature dependency, without causing energy level degeneration of the electrodes or firing layers fabricated from metal silicides or metal polycides with low resistance.

Various modifications and variations could be made to the invention without departing from the scope or spirit of the invention.

What is claimed is:

1. A semiconductor device comprising:
   a semiconductor substrate of first conductivity;
   a first impurity region of second conductivity which is formed on the substrate;
   a second impurity region of the second conductivity which is formed in the substrate and spaced apart from said first impurity region;
   a channel region located between the first and second impurity regions;
   an insulation layer on the channel region; and
   a gate electrode formed on the insulation layer, said gate electrode including conductive layer means for decreasing the temperature dependence of the semiconductor device, said layer means including a semiconductive layer containing the impurity ions of the second conductivity of levels less than $10^{16}$/cm$^3$ which are insufficient to cause an energy level degeneration thereof and a conductive layer formed on the semiconductive layer.

2. A semiconductor device according to claim 1, wherein said semiconductive layer includes polycrystalline silicon.

3. A semiconductor device according to claim 1, wherein said conductive layer includes a metal silicide.

4. A semiconductor device according to claim 1, wherein said conductive layer includes a metal polycide.

5. A semiconductor device according to claim 2, wherein said polycrystalline silicon layer has an impurity concentration of less than $1 \times 10^{19}$ cm$^{-3}$.

6. A semiconductor device according to claim 3, wherein said metal silicide includes at least one member selected from the group consisting of molybdenum silicide, tungsten silicide, tantalum silicide, platinum silicide, titanium silicide , cobalt silicide, nickel silicide, and palladium silicide.

7. A semiconductor device according to claim 3, wherein the formation ratio of silicon to metal in said metal silicide is more than 2.

* * * * *